United States Patent
Suzuki et al.

(10) Patent No.: US 6,563,274 B2
(45) Date of Patent: May 13, 2003

(54) LIGHT-EMITTING ELEMENT DRIVE CIRCUIT

(75) Inventors: Takashi Suzuki, Hamamatsu (JP); Seiichiro Mizuno, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 0 days.

(21) Appl. No.: 10/084,340

(22) Filed: Feb. 28, 2002

(65) Prior Publication Data

US 2002/0117974 A1 Aug. 29, 2002

(30) Foreign Application Priority Data

Feb. 28, 2001 (JP) .......... 2001-055284

(51) Int. Cl.⁷ .......... H05B 37/02; H01J 40/14
(52) U.S. Cl. .......... 315/291; 250/214 R; 315/219
(58) Field of Search .......... 315/291, 209 R, 315/219, 225; 250/214 R, 214.1, 214 A, 214 LA, 214 LS

(56) References Cited

U.S. PATENT DOCUMENTS

| | | | | |
|---|---|---|---|---|
| 4,599,494 A | * | 7/1986 | Welty | 379/375.01 |
| 4,885,477 A | * | 12/1989 | Bird et al. | 327/52 |
| 5,670,910 A | * | 9/1997 | Kato | 330/253 |
| 5,764,086 A | * | 6/1998 | Nagamatsu et al. | 327/65 |
| 5,898,334 A | * | 4/1999 | Fairgrieve | 37/411 |
| 6,166,530 A | * | 12/2000 | D'Angelo | 323/316 |
| 6,188,059 B1 | * | 2/2001 | Nishiyama et al. | 250/214 R |
| 6,388,695 B1 | * | 5/2002 | Nagumo | 347/237 |
| 6,389,050 B2 | * | 5/2002 | Stronczer | 372/38.02 |
| 6,396,610 B1 | * | 5/2002 | Okayasu | 359/163 |

* cited by examiner

Primary Examiner—Don Wong
Assistant Examiner—Chuc D Tran
(74) Attorney, Agent, or Firm—Morgan, Lewis & Bockius LLP

(57) ABSTRACT

A light-emitting element drive circuit is provided whereby level variation of the drive current can be suppressed. This circuit is provided with a detection circuit 4 that detects the DC current component I6' of high-frequency current I4 (I5) flowing through a second current mirror circuit 2, and an adjustment circuit 5 that subtracts the DC current component I6' detected by the detection circuit 4 from the DC current I1 (I7) flowing through line 1B of first current mirror circuit 1. Thus, level variation of the drive current IL' which represents the superposition of the DC and high-frequency can be suppressed.

1 Claim, 4 Drawing Sheets

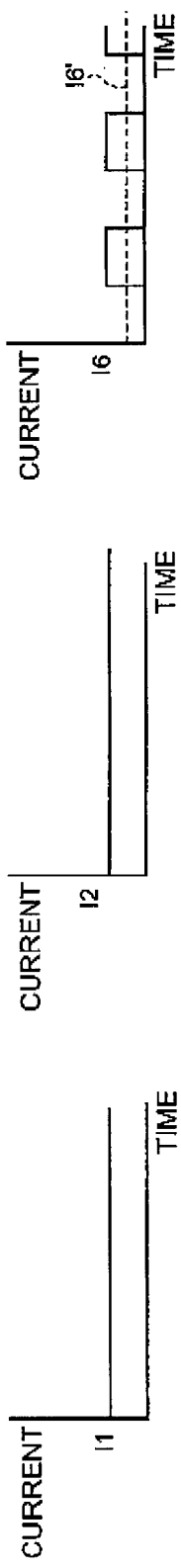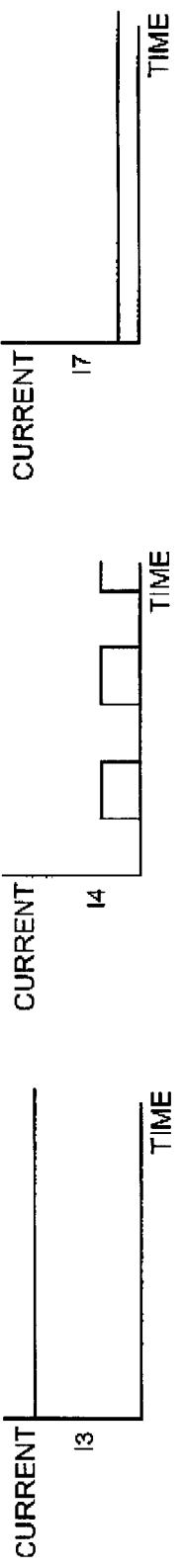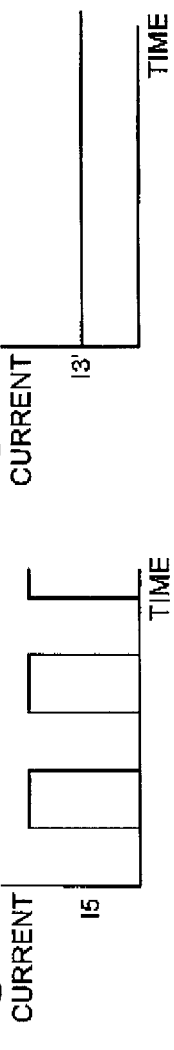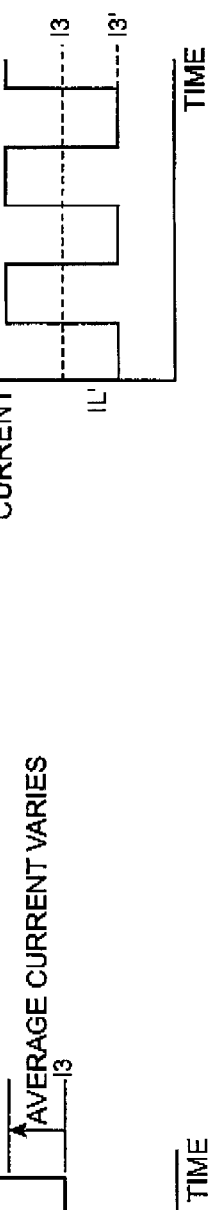

LIGHT-EMITTING ELEMENT DRIVE CIRCUIT

BACKGROUND OF THE INVENTION

1. Field of the Invention

The present invention relates to a light-emitting element drive circuit.

2. Related Background Art

An optical pickup is a device that is capable of reading information stored on the recording medium by monitoring the reflected light therefrom. In some cases, a laser diode is also employed for writing information on to a recording medium. Drive circuits for such laser diodes have previously been developed.

In an optical pickup, undesirable light reflected within the device enters the photodetector and becomes noise contained in the necessary information. Noise is also caused by instability of the light emission of the light-emitting element when light reflected by the storage medium returns to and enters the light-emitting element.

Techniques for driving the light-emitting element at high-frequency have therefore been considered in order to suppress the noise (mode-hop noise). High-frequency current is superimposed on the DC current component which is supplied to the light-emitting diode as the drive current. A suitable frequency for the high-frequency capable of being employed in current CD players is 300 to 500 MHz.

In order to lower power consumption, the possibility of not supplying such high-frequency current to the light-emitting element has also been considered. The average value of the high-frequency current itself also varies with temperature and deterioration over a period of years. When the average value of the high-frequency current varies in this way, the level of the drive current varies. When high-speed reading is performed, the decline of the light intensity increases the likelihood of occurrence of spurious detection being produced by small level variations. It is therefore preferable that level variation should be small.

SUMMARY OF THE INVENTION

In view of the above, an object of the present invention is to provide a light-emitting element drive circuit in which drive current is produced by superimposing a high-frequency current component on a DC current component and supplying this to the light-emitting element but wherein level variation of this drive current can be suppressed.

In order to solve the problem described above, in a light-emitting element drive circuit according to the present invention, in which, in first and second current mirror circuits having respective parallel lines, the respective one side of the lines is connected to the light-emitting element and respectively DC current and high-frequency current are passed to the respective other side of the lines in the first and second current mirror circuits, drive current resulting from the superposition of the high-frequency current on the DC current being supplied to the light-emitting element through the node of the connection, wherein the DC current component of the high-frequency current flowing through the second current mirror circuit is detected and the detected DC current component is arranged to be subtracted from the DC current flowing through the respective other side of the lines of the first current mirror circuit.

That is, when the DC current component of the high-frequency current in the second current mirror circuit increases, the average value of the drive current applied as the sum of the currents flowing through both of the one-side lines of the first and second current mirror circuits is increased.

When the DC current component of the high-frequency current flowing through the second current mirror circuit is increased, the amount of this increase is subtracted from the DC current flowing through the other-side line of the first current mirror circuit. Since the drive current results from the superposition, on the high-frequency current, of a DC current equal or proportional to the DC current flowing through the other side of the first current mirror circuit, variation of the average value of the drive current can be suppressed by subtraction of the amount of the aforesaid increase from the drive current.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3A, 3B, 3C, 3D, 3E, 3F, 3G, 3H, 3I and 3J are graphs illustrating current waveforms.

DESCRIPTION OF THE PREFERRED EMBODIMENTS

A light-emitting element drive circuit according to an embodiment is described below. Identical elements are given the same reference symbols to avoid duplicated description. This light-emitting element drive circuit comprises a main circuit wherein high-frequency current is superimposed on a DC current component and an auxiliary circuit for stabilizing the drive current. First of all, the main circuit will be described.

Figure 1:
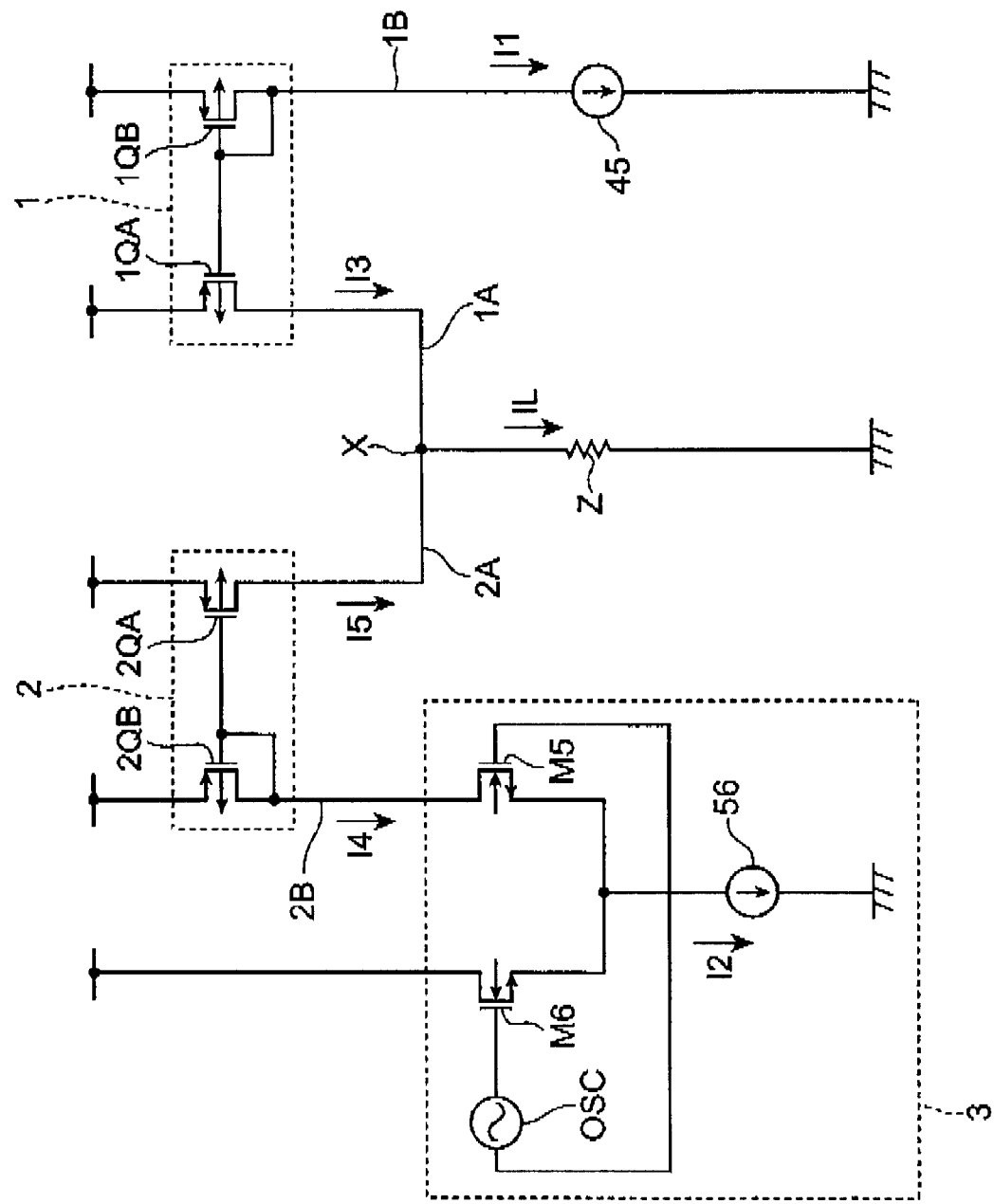
FIG. 1 is a circuit diagram illustrating a main circuit of the light-emitting element drive circuit.

FIG. 1 is a circuit diagram of a main circuit in the light-emitting element drive circuit. FIGS. 3A, 3B, 3C, 3D, 3E, 3F, 3G, 3H, 3I and 3J are graphs illustrating current waveforms. The respective Figures indicating the waveforms of currents I1, I2, I3, I4, I5, I6, I7, I3', IL, IL' in the following description.

This main circuit is a circuit wherein one each of lines (1A, 2A) in first and second current mirror circuits 1, 2 respectively having parallel lines (1A and 1B, 2A and 2B) is connected to a light-emitting element Z (the node is designated as X), while respectively DC current I1 and high-frequency current I4 (pulse current) are passed through the other ones (1B, 2B) of the aforesaid lines in these first and second current mirror circuits 1, 2.

Current mirror circuits 1 and 2 respectively comprise two transistors (1QA and 1QB, 2QA and 2QB) and have two parallel lines (1A and 1B, 2A and 2B). The currents I3, I5 flowing through the lines on the one side 1A, 2A are respectively equal to or proportional to the currents I1, I4 flowing through the lines on the other side 1B, 2B.

Consequently, if the currents I1, I4 flowing in the lines on the other side 1B, 2B are controlled, the drive current IL flowing through light-emitting element Z connected to the lines on the one side 1A, 2A can be controlled.

It should be noted that if the transistor sizes in the current mirror circuits are the same, the currents flowing through both lines are the same, but if they are different they are proportional to the size ratio.

The pulse form drive current IL is the sum of the DC current I3 and the high-frequency current (pulse current) I5. However, these currents are equal to or proportional to the currents I1, I4 flowing in the lines 1B, 2B that are paired with the lines 1A, 2A through which these respectively flow, so the drive current IL, is the sum or a value proportional to this sum of the DC current I1 and high-frequency current I4.

The main circuit of this light-emitting element drive circuit supplies drive current IL obtained by superimposing high-frequency current I5 on DC current I3 through node X of the connection described above to light-emitting element Z.

In order to pass DC current I3 through line 1A, DC current I1 must be passed through line 113. The source of transistor 1QB is therefore connected to the power source potential and its drain is connected to ground through constant current source 45. Transistor 1QB in this example is a p-channel field-effect transistor whose gate and drain are short-circuited.

In order to pass high-frequency current I5 through line 2A, high-frequency current I4 must be passed through line 2B. The source of transistor 2QB is therefore connected with power source potential and high-frequency voltage is supplied to the source and gate. It should be noted that, since, in this embodiment, transistor 2QB is a p-channel field-effect transistor whose gate and drain are short-circuited, this high-frequency voltage will be applied thereto if the potential of the drain varies periodically. This drain potential is made to vary by a high-frequency generating circuit 3 connected with this drain.

High-frequency generating circuit 3 is a current chopper circuit comprising n-channel field-effect transistors M5, M6; the drain of transistor M5 is connected with the drain of transistor 2QB. The total of the currents flowing through the two channels of these transistors M5, M6 is kept fixed by a constant current source 56.

Since an oscillator OSC is provided between the gates of transistors M5, M6, the potential of these gates varies periodically and the potential between the gate and source varies in complementary fashion in these two transistors M5 and M6. If a positive voltage is applied to the gate of transistor M5, the current I4 varies in response to the magnitude of the voltage, so the drain potential varies, causing current I4 to vary in a manner synchronized with the oscillation of oscillator OSC.

In an optical pickup, undesirable light reflected within the device enters the photodetector and becomes noise contained in the necessary information. Noise is also caused by instability of the light emission of the light-emitting element when light reflected by the storage medium returns to and enters the light-emitting element. Consequently, in order to suppress the noise, DC current is superimposed on the high-frequency current in the main circuit, and this is supplied to light-emitting element Z as drive current. A suitable frequency for the high-frequency capable of being employed in current CD players is 300 to 500 MHz.

However, when the average value of the high-frequency current changes, the level of the drive current varies. When high speed reading is performed, the decline of the light intensity increases the likelihood of occurrence of spurious detection been produced by small level variations. It is therefore preferable that level variation should be small. Accordingly, in the present light-emitting element drive circuit, an auxiliary circuit is provided in the main circuit.

Figure 2:
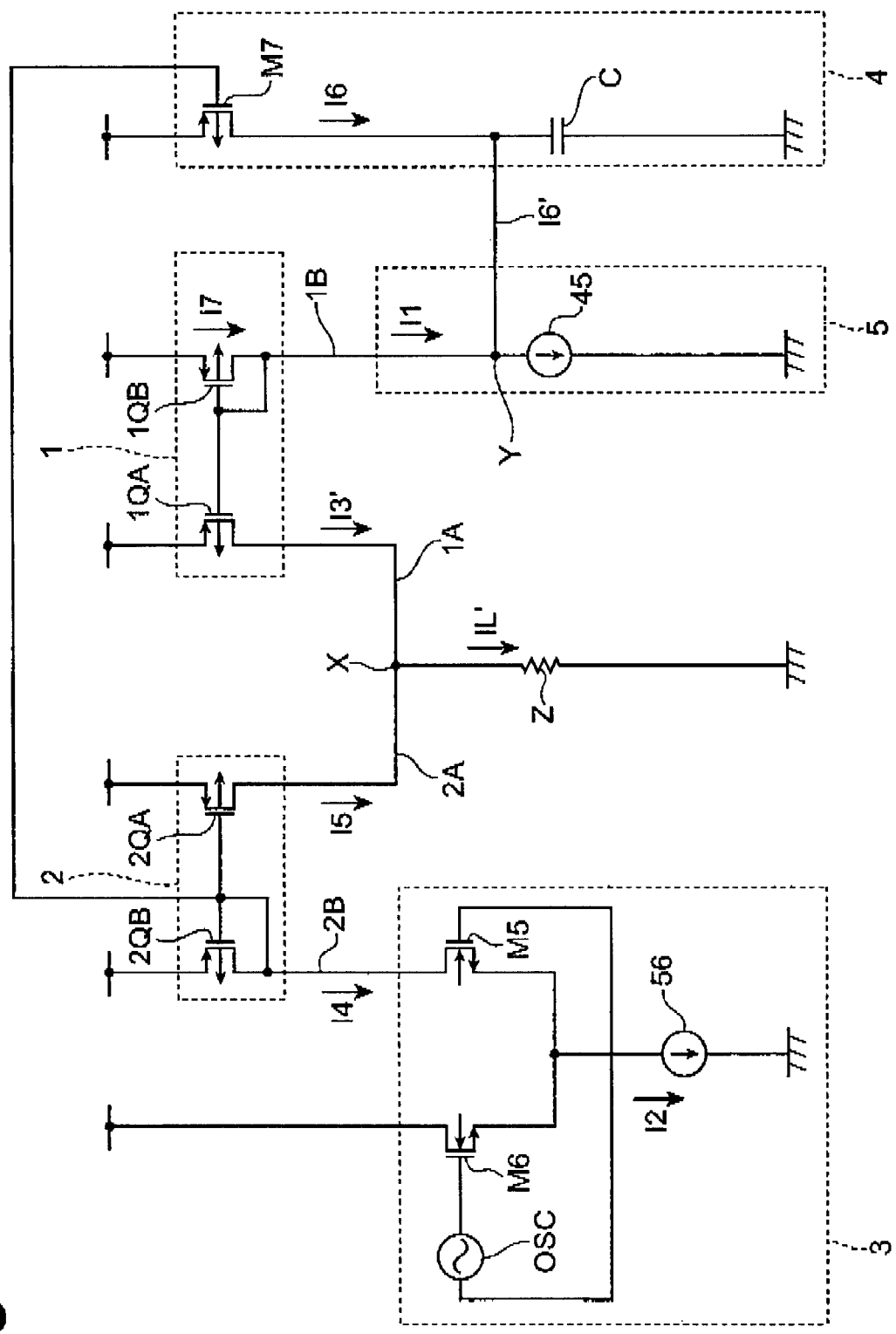
FIG. 2 is a circuit diagram illustrating a light-emitting element drive circuit.

FIG. 2 is a circuit diagram of a light-emitting element drive circuit wherein an auxiliary circuit is provided in addition to the main circuit. The auxiliary circuit comprises a detection circuit 4 that detects the DC current component I6' of the high-frequency current I4 (I5) flowing through second current mirror circuits 2 and an adjustment circuit 5 wherein the DC current component I6' detected by detection circuit 4 is subtracted from the DC current I1 (current I7 in FIG. 2) flowing through the other side line 1B of the aforesaid lines of first current mirror circuit 1. This is described in detail below.

Detection circuit 4 comprises a transistor M7 provided with a capacitative element (for AC removal) C interposed between the power source potential and ground. The gate of transistor M7 is connected with the gate of transistor 2QB in the second current mirror circuit 2, so that a voltage synchronized with and proportional to the high-frequency current I4 is applied between the gate of transistor M7 and the power source potential. That is, a high-frequency current I6 whose repetition frequency coincides with that of the high-frequency current I4 and whose amplitude is proportional thereto therefore flows between the source and drain of transistor M7.

Transistor 2QB and transistor M7 constitute a current mirror circuit.

Since the AC current component contained in the high-frequency current I6 flows to ground through capacitative element C, only the DC current component I6' contained in high-frequency current I6 flows into constant current source 45. Detection circuit 4 therefore indirectly detects the DC current component I6' of high-frequency current I4 (I5) flowing through the second current mirror circuit 2. Capacitative element C could be substituted by the gate capacitances of transistors 1QA and 1QB.

Adjustment circuit 5 comprises a current superposition section Y in which DC current component I6' is superimposed on current I7 and a constant current source 45 that inputs the output current of current superposition section Y. That is, since a constant current I1 flows in constant current power source 45, when the detected DC current component I6' is increased, the current I7 flowing through the other-side line 1B of first current mirror 1 is decreased.

Specifically, (current I7)=(current I1)−(current I6'). Thus, adjustment circuit 5 subtracts the DC current component I6' detected by detection circuit 4 from the DC current I7 flowing through the other side 1B of the aforesaid lines of first current mirror circuit 1.

When current I6' increases, current I7 decreases, and the current I3 flowing through the one-side line 1A of the first current mirror circuit 1 diminishes (the diminished current will be called I3'). The DC component of the drive current IL supplied to light-emitting element Z therefore diminishes (the diminished current will he called IL').

Thus, as described above, when the DC current component I6' of the high-frequency current I4 in second current mirror circuit 2 increases, the average value (level) of the drive current IL that is supplied as the sum or the currents flowing through both of the one-side lines 1A, 2A of the first and second current mirror circuits 1, 2 increases, but, when the DC current component I6' of the high-frequency current I4 flowing through second current mirror circuit 2 increases, the amount of this increase (I6') is subtracted from the DC current I1 flowing through the other side line 1B of first current mirror circuit 1 (I7−I1−I6').

Since the drive current IL (IL') is the result of superimposition on the high-frequency current I5 of DC current I3' equal to or proportional to the DC current I7 flowing through the other-side line 1B of the first current mirror circuit 1, variation of the average value (level) of drive current IL' can be suppressed, by the amount of this increase (I6') being subtracted from drive current IL.

Although, in the above, p-channel field-effect transistors were employed as transistors 1QA, 1QB, 2QA, 2QB and M7, their respective sources being connected with the power source potential, these could be substituted by for example PNP bipolar transistors.

Also, although, in the above, n-channel field-effect transistors were employed for transistors M5 and M6, their drains being connected with the power source potential, these could be substituted by for example NPN bipolar transistors. However, it should be noted that the source, gate and drain referred to in the case of the field-effect transistors should be regarded as emitter, base and collector in the case of bipolar transistors.

Also, if the polarity of the transistors is appropriately set, the direction of current flow may be opposite to that described above.

Furthermore, a suitable circuit with no external input may be provided between transistor 1QB and the node (current superposition section) Y.

In the light-emitting element drive circuit described above, variation of the average value of the drive current IL (IL') is suppressed, so, in the case where the light-emitting element Z is taken to be a laser diode, there is no variation in the intensity of the laser beam resulting from the presence or absence of superimposed high-frequency when this is driven. This is beneficial in particular in the case where a hologram is employed in an optical system.

Figure 4:
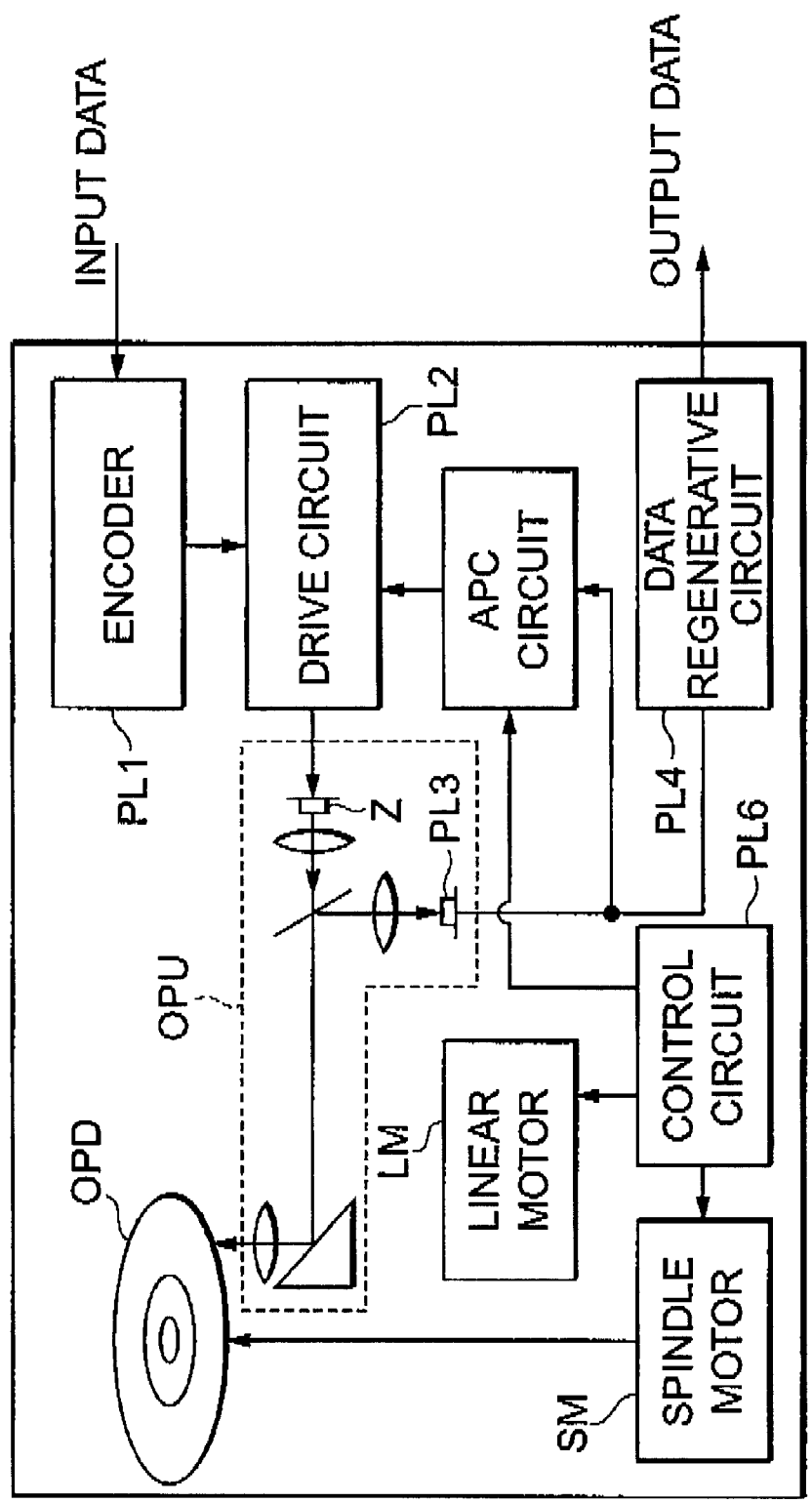
FIG. 4 is a circuit diagram of optical disk player using the circuit shown in FIG. 1.

FIG. 4 is a circuit diagram of optical disk player using the drive circuit shown in FIG. 1. The input data for writing is encoded by an encoder PL1 such as EFM circuit. The encoded data is applied to for example a control terminal that controls the current flow of the current source 45. The light-emitting element Z, laser diode emits laser light in response to the encoded data.

When the optical disk OPD receives the laser light beam for writing, a recording layer of the optical disk OPD changes its physical structure and the data is recorded in the optical disk OPD. The reflected laser light beam by the optical disk OPD is detected by a photodiode PL3.

When the optical disk OPD in illuminated by the laser light beam for reading that is modulated by the high frequency, the electric output from the photodiode PL3 is inputted into a data regenerative circuit PL4 and the recorded data is extracted. The electric output is also applied to an auto power control (APC) circuit PL5 that controls the power applied to the light-emitting element Z. The APC circuit PL5 is controlled by a control circuit PL6. Note that such an APC control is used during writing, too.

The control circuit PL6 also controls a spindle motor SM for rotating the optical disk OPD and a linear motor LM for moving the optical pick-up unit OPU including light-emitting element Z.

When the photodiode PL3 has multi-divided photosensitive areas, the electrical output from the photodiode PL3 may be used for focusing the laser light beam. This focusing technique is conventional.

The control circuit PL6 decides the laser power by the required physical status of the recording layer when the optical disk is CD-RW. For example, a middle power heating by laser light beam and gradual cooling causes the recording layer to become a crystalline. High power heating and rapid cooling causes the recording layer to become amorphous.

The control circuit PL6 may decide the laser power by the kind of the optical disk OPD because the required laser power differs by the kind of the optical disk.

Thus, as described above, level variation of the drive current can be suppressed with the light-emitting element drive circuit of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light-emitting element drive circuit, in which, in first and second current mirror circuits having respective parallel lines, the respective one side of said lines is connected to said light-emitting element and respectively DC current and high-frequency current are passed to the respective other side of said lines in said first and second current mirror circuits, drive current resulting from the superposition of the high-frequency current on the DC current being supplied to said tight-emitting element through the node of said connection, wherein the DC current component of the high-frequency current flowing through said second current mirror circuit is detected and the detected DC current component is arranged to be subtracted from the DC current flowing through said respective other side of said lines of said first current mirror circuit.

* * * * *